United States Patent
Chen

[19]

[11] Patent Number: 6,008,131
[45] Date of Patent: Dec. 28, 1999

[54] BOTTOM ROUNDING IN SHALLOW TRENCH ETCHING USING A HIGHLY ISOTROPIC ETCHING STEP

[75] Inventor: Chao-Cheng Chen, Maton, Taiwan

[73] Assignee: Taiwan Semiconductor Manufacturing Company Ltd., Hsin-Chu, Taiwan

[21] Appl. No.: 08/995,340

[22] Filed: Dec. 22, 1997

[51] Int. Cl.⁶ .................................................. H01L 21/302
[52] U.S. Cl. .......................................... 438/710; 438/712
[58] Field of Search ................................ 438/712, 710, 438/700

[56] References Cited

U.S. PATENT DOCUMENTS

| | | | |
|---|---|---|---|
| 4,484,978 | 11/1984 | Keyser | 216/47 |
| 4,589,952 | 5/1986 | Behringer et al. | 216/2 |
| 4,639,288 | 1/1987 | Price et al. | 156/643 |
| 4,690,729 | 9/1987 | Douglas | 438/695 |
| 4,729,815 | 3/1988 | Leung | 156/643 |
| 4,855,017 | 8/1989 | Douglas | 156/643 |
| 5,143,820 | 9/1992 | Kotecha et al. | 430/314 |
| 5,239,601 | 8/1993 | Denis et al. | 385/49 |
| 5,258,332 | 11/1993 | Horioka et al. | 437/228 |
| 5,308,415 | 5/1994 | Chou | 438/714 |
| 5,605,603 | 2/1997 | Grimard et al. | 156/662.1 |
| 5,651,858 | 7/1997 | Lin | 156/646.1 |

*Primary Examiner*—Felisa Hiteshew
*Attorney, Agent, or Firm*—George O. Saile; Stephen B. Ackerman; Larry J. Prescott

[57] ABSTRACT

A method of forming shallow isolation trenches in integrated circuit wafers which prevents wafer damage due to dislocations or the like occurring at sharp corners at the intersection between the sidewalls and bottom of the trench. A trench is formed in the wafer using a series of reactive ion etching steps. The bottom of the trench is then etched using reactive ion etching with etching parameters chosen to produce dry isotropic etching. The dry isotropic etching of the bottom of the trench results in a rounded bottom and sharp corners between the sidewalls and bottom of the trench are avoided.

22 Claims, 3 Drawing Sheets

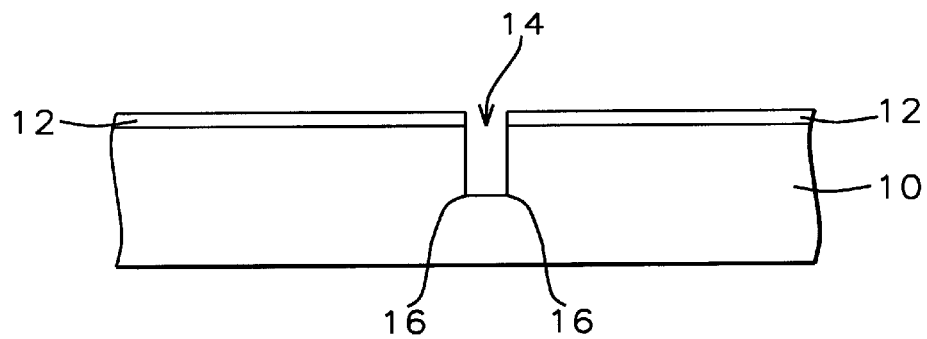
FIG. 1 – Prior Art
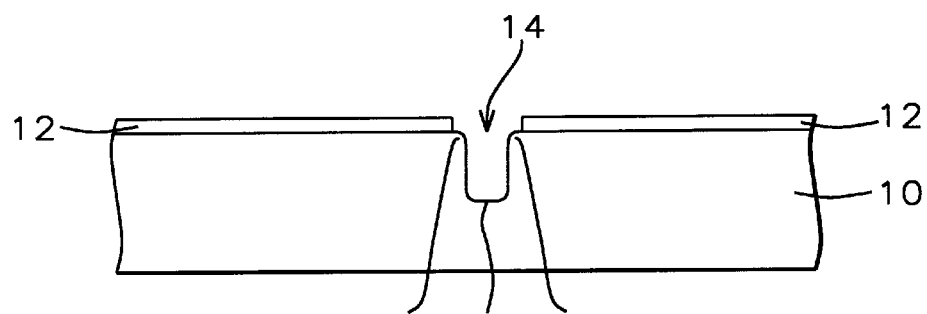
FIG. 2
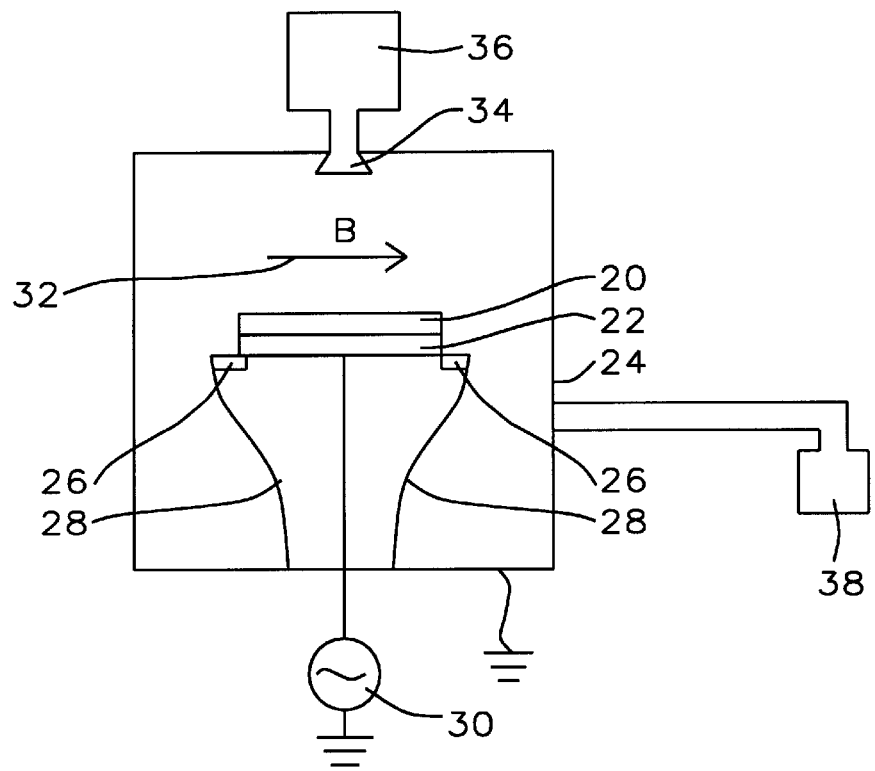
FIG. 3

BOTTOM ROUNDING IN SHALLOW TRENCH ETCHING USING A HIGHLY ISOTROPIC ETCHING STEP

BACKGROUND OF THE INVENTION (1) Field of the Invention

This invention relates to the forming of trenches in a silicon substrate for shallow trench isolation and more specifically to using a dry isotropic etching step to form a rounded bottom of the trench and avoid sharp corners at the intersection of the sidewalls and bottom of the trench.

(2) Description of the Related Art

Shallow isolation trenches are frequently used for device isolation in integrated circuit wafers. These trenches are formed using dry isotropic etching and result in sharp corners 16 at the intersection between the bottom and the sidewalls of the trenches, see FIG. 1. These sharp corners cause stresses in the wafer when the trenches are filled with a dielectric and can result in wafer damage.

Polymer deposition is used to produce a rounded bottom of the trench and avoid the problem of the sharp corners. The use of polymer deposition, however, produces undesirable sloped edges of the trench. As dimensions of the trenches become smaller a steep trench profile is required. The use of the polymer deposition also reduces the mean time between chamber cleaning which adds to the cost of the use of trenches for isolation.

U.S. Pat. No. 4,855,017 to Douglas describes methods for etching trenches using reactive ion etching in a single wafer etcher. This methods uses passivation of the sidewall by passivation on a molecular scale to control the profile of the trench.

U.S. Pat. No. 4,729,815 to Leung describes a method of etching trenches with rounded top corners and rounded bottom corners. This method uses $CHF_3$ as an etchant and the DC bias is adjusted differently for three different steps to provide profile control.

U.S. Pat. No. 5,068,202 to Crotti et al. describes a method of forming trenches using reactive ion etching of an ONO multilayer through a mask to define active areas of the substrate. A successive deposition of a conformable TEOS oxide followed by a blanket reactive ion etch leaves tapered oxide spacers on the flanks of the ONO multilayer. Isotropic plasma etching is then used to form a round profile trench with a rounded bottom and sloping sides.

U.S. Pat. No. 4,639,288 to Price et al. describes a method of forming trenches where the top part of the trench is wider than the lower part of the trench resulting in a tapered sidewall profile.

U.S. Pat. No. 5,651,858 to Lin describes a method of forming trenches having a tapered profile using a $NF_3$/HBr plasma etch.

U.S. Pat. No. 5,605,603 to Grimard et al. describes a method of forming deep, narrow, uniform trenches in a silicon substrate. The method uses a plasma generated from HBr, $NF_3$, and $O_2$.

U.S. Pat. No. 5,258,332 to Horioka et al. describes a method of forming rounded trench corners using chemical dry etching and a mixture of fluorine and oxygen.

This invention describes a method of forming round bottoms of a trench using a dry highly isotropic reactive ion etch.

SUMMARY OF THE INVENTION

In integrated circuit wafers means must be employed to electrically isolate devices from one another. Field oxide isolation regions are often used for this purpose as are shallow trench isolation regions. Shallow trench isolation regions, wherein trenches are formed in the substrate and filled with a dielectric such as silicon dioxide or the like, are a very effective means of providing electrical isolation between devices.

Typically trenches are formed using dry anisotropic etching in order to etch a trench 14 through a dielectric layer 12 and into the substrate 10, see FIG. 1. Trenches formed in this manner have sharp corners at the intersection 16 between the bottom and the sidewalls of the trench 14. As device dimensions in integrated circuits shrink the surface dimensions of isolation trenches also shrink while the trench depth must be maintained. This decreasing ratio of width to depth of the trenches places significant stresses at the sharp corners formed in the trenches, particularly at the intersection 18 of the sidewalls and bottom of the trench, and can lead to defects such as dislocations in the substrate crystal when the trench is filled with dielectric.

It is a principle objective of this invention to provide a method of forming a trench for use in shallow trench isolation wherein the intersection of the sidewalls and bottom of the trench forms a smooth rounded surface thereby avoiding excessive stresses in the filled trench.

This objective is achieved by first forming a trench having sidewalls and a bottom in a substrate using dry anisotropic etching. The bottom of the trench is then etched using dry isotropic etching forming a rounded bottom and avoiding sharp corners at the intersection of the sidewalls and bottom of the trench. The trench can then be filled with dielectric without damage to the trench due to stresses at the sharp corners.

BRIEF DESCRIPTION OF THE DRAWINGS

FIG. 1 shows a cross section view of a prior art trench in a substrate wherein the trench has a flat bottom and sharp corners at the intersection of the bottom and sidewalls of the trench.

FIG. 2 shows a cross section view of a trench in a substrate formed using the method of this invention wherein the trench has a rounded bottom and there are no sharp corners at the intersection of the bottom and sidewalls of the trench.

FIG. 3 shows a schematic diagram of a reactive ion etch apparatus.

DESCRIPTION OF THE PREFERRED EMBODIMENTS

Figure 4:
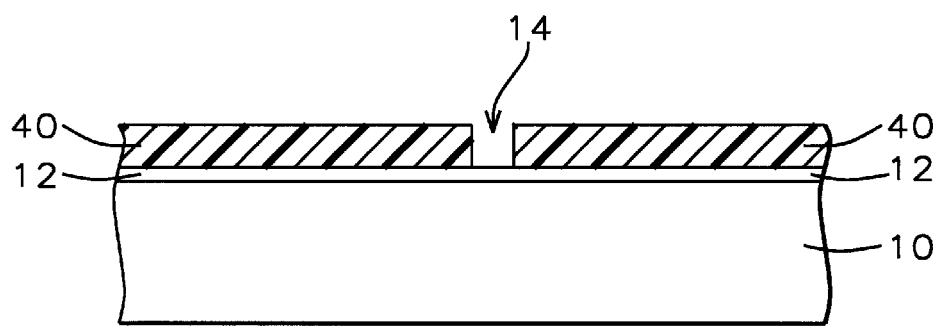
FIG. 4 shows a cross section view of a substrate having a layer of first dielectric formed on the substrate and a patterned layer of resist formed on the layer of first dielectric.

Refer now to FIGS. 2–7 for a description of the method of this invention for forming trenches for shallow trench isolation. FIG. 2 shows a cross section view of a trench 14 formed using the method of this invention. The bottom 19 of the trench is rounded and the sharp corners at the intersection of the sidewalls and bottom of the trench are eliminated. The corners 17 of the trench at the surface of the substrate 10 where the trench pattern is etched through the dielectric 12 is also rounded. When the trench is filled with a dielectric the damage which can occur due to stresses at sharp corners is avoided.

The detailed method of forming the trench using the method of this invention will now be described with reference to FIGS. 3–7. FIG. 3 shows a schematic diagram of a reactive ion etching apparatus used in this invention. The reactive ion etch apparatus comprises a wafer holder 22 in a chamber 24. The pressure in the chamber 24 is controlled by a vacuum pump 38 connected to the chamber. A gas supply 36 connected to a nozzle 34 can supply a number of etchant gasses to the chamber. The wafer holder 22 holds a wafer 20 and is attached to a conducting fixture 28 by means of an insulator 26. The conducting fixture 28 is attached to the chamber 24 and both the conducting fixture 28 and the chamber 24 are at ground potential. A power supply 30 supplies electrical power to the wafer holder 22 and a magnetic field source, not shown, is capable of establishing a magnetic field 32 parallel to the surface of the wafer when desired.

Figure 5:
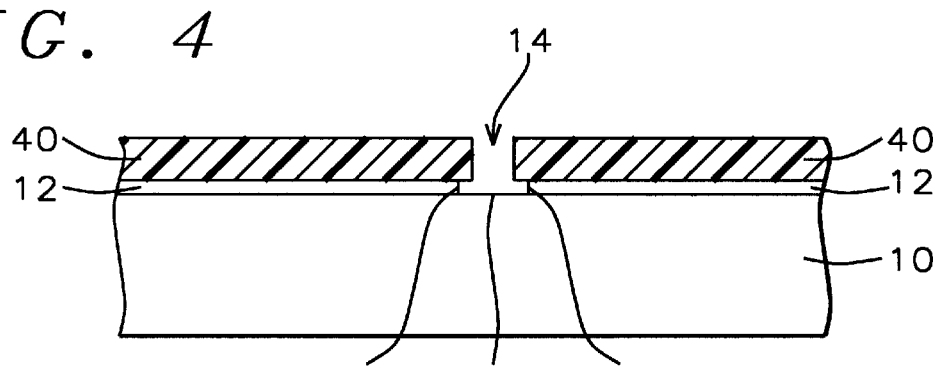
FIG. 5 shows a cross section view of the substrate of FIG. 4 after etching a trench pattern in the layer of first dielectric.

FIG. 4 shows a cross section view of a substrate 10 with a layer of first dielectric 12 formed on the substrate. A patterned layer of resist material 40 with a trench pattern 14 formed therein is formed on the layer of first dielectric 12. In this example the substrate 10 is a silicon integrated circuit wafer and the layer of first dielectric 12 is silicon nitride, $Si_3N_4$. As shown in FIG. 5, the trench pattern 14 is then etched in the layer of first dielectric 12 using a first etch. The first etch is reactive ion etching using a pressure of between about 45 and 55 millitorr, a power of between about 540 and 660 watts, and an etchant comprising $CHF_3$ at a flow rate of between about 9 and 11 standard cubic centimeters per minute, $CF_4$ at a flow rate of between about 13 and 17 standard cubic centimeters per minute, Ar at a flow rate of between about 90 and 110 standard cubic centimeters per minute, and $O_2$ at a flow rate of between about 5.4 and 6.6 standard cubic centimeters per minute. The first etch is continued until the first dielectric layer is overetched and the edges of the trench pattern in the layer of first dielectric 15 are undercut beyond the edges of the trench pattern in the layer of resist. The etching is continued until the perimeter of the edge of the trench pattern in the layer of dielectric is between about 18% and 22% larger than the perimeter of the edge of the trench pattern in the layer of resist.

Figure 6:
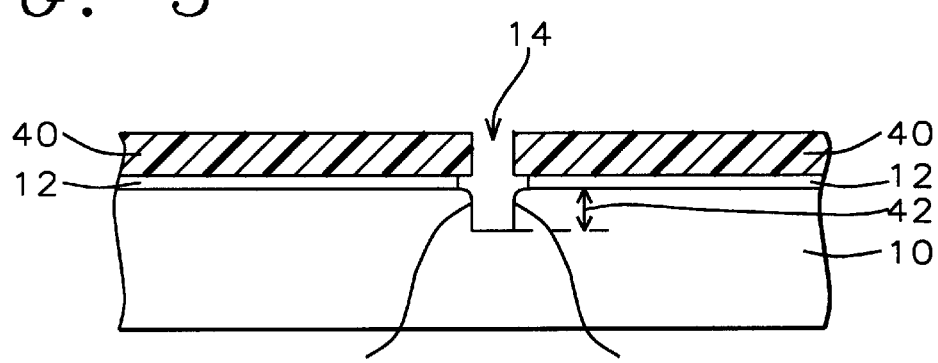
FIG. 6 shows a cross section view of the substrate of FIG. 5 after etching the trench pattern a first depth into the substrate.

There will be a native oxide on the surface 18 of the substrate. The trench pattern is then etched in this native oxide layer using a second etch. The second etch is reactive ion etching for between about 4.5 and 5.5 seconds using a pressure of between about 90 and 110 millitorr, a power of between about 360 and 440 watts, and an etchant of $CF_4$ at a flow rate of between about 30 and 40 standard cubic centimeters per minute. As shown in FIG. 6, the trench pattern is then etched a first depth 42 into the substrate 10 using a third etch. The third etch is reactive ion etching for between about 7 and 9 seconds using a pressure of between about 72 and 88 millitorr, a power of between about 450 and 550 watts, a magnetic field of between about 9 and 11 gauss, and an etchant comprising HBr at a flow rate of between about 85 and 105 standard cubic centimeters per minute, $Cl_2$ at a flow rate of between about 13 and 17 standard cubic centimeters per minute, and $HeO_2$ at a flow rate of between about 27 and 33 standard cubic centimeters per minute. Due to the overetch of the first dielectric layer in the first etch the third etch also rounds the edges 17 of the trench at the surface of the substrate. The first depth is between about 500 and 1500 Angstroms.

Figure 7:
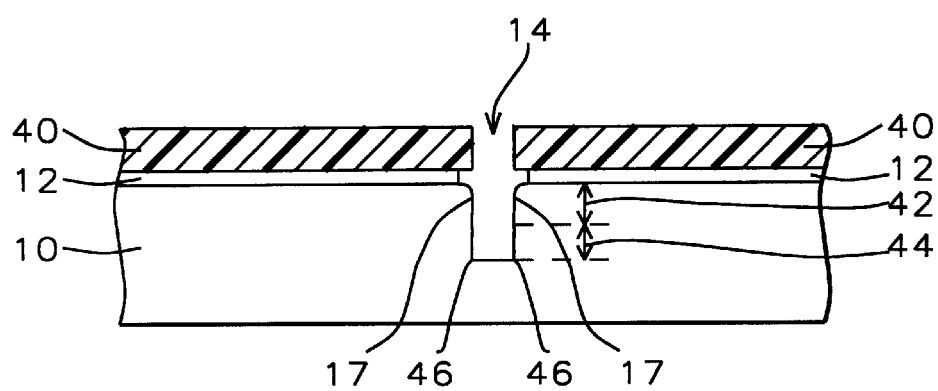
FIG. 7 shows a cross section view of the substrate of FIG. 6 after etching the trench pattern a second depth into the substrate.

As shown in FIG. 7, the trench pattern is then etched a second depth 44 into the substrate 10 using a fourth etch. The fourth etch is reactive ion etching for between about 58 and 72 seconds using a pressure of between about 90 and 110 millitorr, a power of between about 450 and 550 watts, a magnetic field of between about 9 and 11 gauss, and an etchant comprising HBr at a flow rate of between about 85 and 105 standard cubic centimeters per minute, $Cl_2$ at a flow rate of between about 13 and 17 standard cubic centimeters per minute, and HeO at a flow rate of between about 27 and 33 standard cubic centimeters per minute. The second depth 44 is between about 2000 and 3000 Angstroms.

Figure 8:
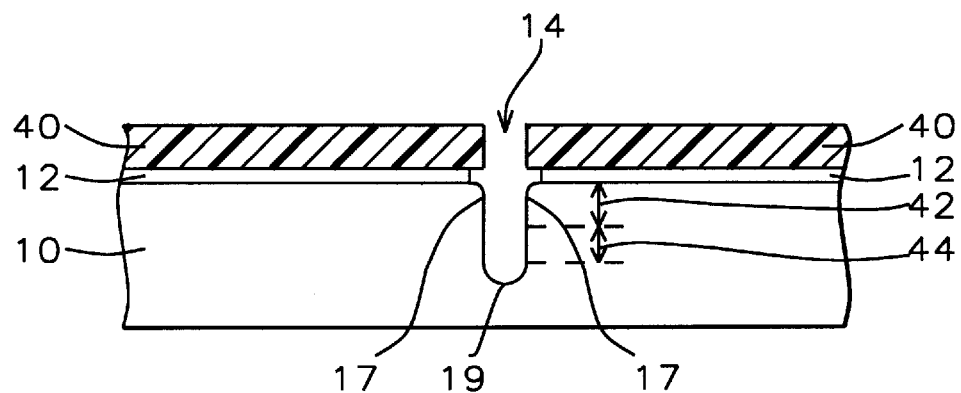
FIG. 8 shows a cross section view of the substrate of FIG. 7 with a trench in the substrate after etching the bottom of the trench using dry isotropic etching thereby forming a rounded bottom and avoiding sharp corners at the intersection of the bottom and sidewalls of the trench.

As shown in FIG. 7, the intersection between the sidewalls and bottom of the trench results in sharp corners 46 which frequently cause problems such as dislocations or the like when the trench is filled with dielectric. The next step is the key step of the invention and is the step which eliminates the sharp corners 46 while retaining vertical sidewalls. As shown in FIG. 8, the bottom of the trench is etched using a fifth etch which is a dry isotropic etch. This dry isotropic etch forms a rounded bottom 19 and eliminates sharp corners at the intersection of the sidewalls and bottom of the trench. The fifth etch is reactive ion etching for between about 8 and 12 seconds at a pressure of between about 135 and 165 millitorr, a power of between about 90 and 110 watts, a magnetic field of between about 72 and 88 gauss, and an etchant comprising $CF_4$ at a flow rate of between about 45 and 55 standard cubic centimeters per minute and He at a flow rate of between about 45 and 55 standard cubic centimeters per minute.

Figure 9:
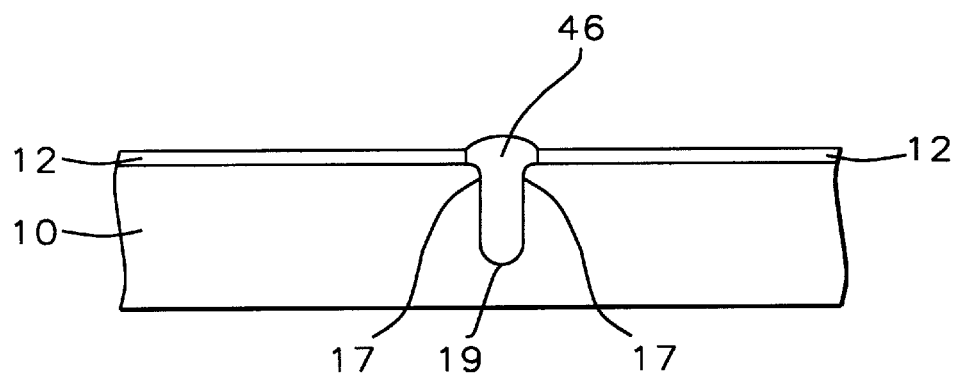
FIG. 9 shows a cross section view of the substrate of FIG. 8 after removing the layer of resist and filling the trench with a second dielectric.

As shown in FIG. 9, the patterned layer of resist is then removed and the trench is filled with a second dielectric such as silicon dioxide or silicon nitride.

While the invention has been particularly shown and described with reference to the preferred embodiments thereof, it will be understood by those skilled in the art that various changes in form and details may be made without departing from the spirit and scope of the invention.

What is claimed is:

1. A method of forming trenches, comprising the steps of:
    providing a substrate having a first surface;
    providing a layer of first dielectric formed on said first surface of said substrate;
    etching a trench pattern having trench pattern edges in said layer of first dielectric using a first dry anisotropic etching means;
    etching said trench pattern in said first surface of said substrate using a second dry anisotropic etching means;
    etching said trench pattern a first depth into said substrate and etching said trench pattern edges of said first surface of said substrate using a third dry anisotropic etching means;
    etching said trench pattern a second depth into said substrate using a fourth dry anisotropic etching means thereby forming a trench having sidewalls and a bottom in said substrate;

etching said bottom of said trench using dry isotropic etching thereby forming a rounded bottom of said trench and avoiding sharp corners at the intersection of said sidewalls and said bottom of said trench; and filling said trench with a second dielectric material.

2. The method of claim 1 wherein said isotropically etching said bottom of said trench uses reactive ion etching for between about 8 and 12 seconds at a pressure of between about 135 and 165 millitorr, a power of between about 90 and 110 watts, a magnetic field of between about 72 and 88 gauss, and an etchant comprising $CF_4$ at a flow rate of between about 45 and 55 standard cubic centimeters per minute and He at a flow rate of between about 45 and 55 standard cubic centimeters per minute.

3. The method of claim 1 wherein said substrate is a silicon integrated circuit wafer.

4. The method of claim 1 wherein said first dielectric is $Si_3N_4$.

5. The method of claim 1 wherein said second dielectric is silicon dioxide.

6. The method of claim 1 wherein said first dry anisotropic etching means comprises reactive ion etching using a pressure of between about 45 and 55 millitorr, a power of between about 540 and 660 watts, and an etchant comprising $CHF_3$ at a flow rate of between about 9 and 11 standard cubic centimeters per minute, $CF_4$ at a flow rate of between about 13 and 17 standard cubic centimeters per minute, Ar at a flow rate of between about 90 and 110 standard cubic centimeters per minute, and $O_2$ at a flow rate of between about 5.4 and 6.6 standard cubic centimeters per minute.

7. The method of claim wherein said second dry anisotropic etching means comprises reactive ion etching for between about 4.5 and 5.5 seconds using a pressure of between about 90 and 110 millitorr, a power of between about 360 and 440 watts, and an etchant of $CF_4$ at a flow rate of between about 30 and 40 standard cubic centimeters per minute.

8. The method of claim 1 wherein said third dry anisotropic etching means comprises reactive ion etching for between about 7 and 9 seconds using a pressure of between about 72 and 88 millitorr, a power of between about 450 and 550 watts, a magnetic field of between about 9 and 11 gauss, and an etchant comprising HBr at a flow rate of between about 85 and 105 standard cubic centimeters per minute, $Cl_2$ at a flow rate of between about 13 and 17 standard cubic centimeters per minute, and $HeO_2$ at a flow rate of between about 27 and 33 standard cubic centimeters per minute.

9. The method of claim 1 wherein said fourth dry anisotropic etching means comprises reactive ion etching for between about 58 and 72 seconds using a pressure of between about 90 and 110 millitorr, a power of between about 450 and 550 watts, a magnetic field of between about 9 and 11 gauss, and an etchant comprising HBr at a flow rate of between about 85 and 105 standard cubic centimeters per minute, $Cl_2$ at a flow rate of between about 13 and 17 standard cubic centimeters per minute, and $HeO_2$ at a flow rate of between about 27 and 33 standard cubic centimeters per minute.

10. The method of claim 1 wherein said first depth is between about 500 and 1500 Angstroms and said second depth is between about 2000 and 3000 Angstroms.

11. A method of forming trenches, comprising the steps of:

providing a substrate having a first surface with a layer of native oxide formed on said first surface;

providing a layer of first dielectric formed on said layer of native oxide;

forming a patterned layer of resist having a trench pattern formed therein on said layer of first dielectric wherein said trench pattern has trench pattern edges and a trench pattern perimeter;

etching said trench pattern in said layer of first dielectric using said patterned layer of resist as a mask and reactive ion etching for a first time using a first pressure, a first power, a first magnetic field, and a first etchant;

etching said trench pattern in said layer of native oxide using said patterned layer of resist as a mask and reactive ion etching for a second time using a second pressure, a second power, a second magnetic field, and a second etchant;

etching said trench pattern a first depth into said substrate and etching said trench pattern edges of said first surface of said substrate using said patterned layer of resist as a mask and reactive ion etching for a third time using a third pressure, a third power, a third magnetic field, and a third etchant thereby forming a partial trench having rounded corners in said substrate;

etching said trench pattern a second depth into said substrate using said patterned layer of resist as a mask and reactive ion etching for a fourth time using a fourth pressure, a fourth power, a fourth magnetic field, and a fourth etchant thereby forming a complete trench having rounded corners and a bottom in said substrate;

etching said bottom of said complete trench using said patterned layer of resist as a mask and reactive ion etching for a fifth time using a fifth pressure, a fifth power, a fifth magnetic field, and a fifth etchant thereby forming a complete trench having a rounded bottom and rounded corners;

removing said patterned layer of resist; and filling said complete trench having a rounded bottom and founded corners with a second dielectric.

12. The method of claim 11 wherein said substrate is a silicon integrated circuit wafer.

13. The method of claim 11 wherein said native oxide is silicon dioxide.

14. The method of claim 11 wherein said first dielectric is $Si_3N_4$.

15. The method of claim 11 wherein said first time is chosen so that said trench pattern perimeter in said layer of first dielectric is between about 18% and 22% larger than said trench pattern perimeter in said patterned layer of resist, said first pressure is between about 45 and 55 millitorr, said first power is between about 540 and 660 watts, and said first etchant comprises $CHF_3$ at a flow rate of between about 9 and 11 standard cubic centimeters per minute, $CF_4$ at a flow rate of between about 13 and 17 standard cubic centimeters per minute, Ar at a flow rate of between about 90 and 110 standard cubic centimeters per minute, and $O_2$ at a flow rate of between about 5.4 and 6.6 standard cubic centimeters per minute.

16. The method of claim 11 wherein said first time is between about 4.5 and 5.5 seconds, said second pressure is between about 90 and 110 millitorr, said second power is between about 360 and 440 watts, and said second etchant is $CF_4$ at a flow rate of between about 30 and 40 standard cubic centimeters per minute.

17. The method of claim 11 wherein said second time is between about 7 and 9 seconds, said third pressure is between about 72 and 88 millitorr, said third power is between about 450 and 550 watts, said first magnetic field is between about 9 and 11 gauss, and said third etchant comprises HBr at a flow rate of between about 85 and 105 standard cubic centimeters per minute, $Cl_2$ at a flow rate of between about 13 and 17 standard cubic centimeters per minute, and $HeO_2$ at a flow rate of between about 27 and 33 standard cubic centimeters per minute.

18. The method of claim 11 wherein said third time is between about 58 and 72 seconds, said fourth pressure is between about 90 and 110 millitorr, said fourth power is between about 450 and 550 watts, said second magnetic field is between about 9 and 11 gauss, and said fourth etchant comprises HBr at a flow rate of between about 85 and 105 standard cubic centimeters per minute, $Cl_2$ at a flow rate of between about 13 and 17 standard cubic centimeters per minute, and $HeO_2$ at a flow rate of between about 27 and 33 standard cubic centimeters per minute.

19. The method of claim 11 wherein said fourth time is between about 8 and 12 seconds, said fifth pressure is between about 135 and 165 millitorr, said fifth power is between about 90 and 110 watts, said third magnetic field is between about 72 and 88 gauss, and said fifth etchant comprises $CF_4$ at a flow rate of between about 45 and 55 standard cubic centimeters per minute and He at a flow rate of between about 45 and 55 standard cubic centimeters per minute.

20. The method of claim 11 wherein said native oxide is silicon dioxide.

21. The method of claim 11 wherein said second dielectric is silicon dioxide.

22. The method of claim 11 wherein said first depth is between about 500 and 1500 Angstroms and said second depth is between about 2000 and 3000 Angstroms.

* * * * *

UNITED STATES PATENT AND TRADEMARK OFFICE
CERTIFICATE OF CORRECTION

PATENT NO. : 6,008,131

DATED : 12/28/99

INVENTOR(S) : Chao-Cheng Chen

It is certified that error appears in the above-identified patent and that said Letters Patent is hereby corrected as shown below:

On the Cover Page, at (75), delete "Maton", and replace with --Tainan--.

Signed and Sealed this

Twenty-seventh Day of March, 2001

Attest:

NICHOLAS P. GODICI

Attesting Officer

Acting Director of the United States Patent and Trademark Office